(12) United States Patent
Deng et al.

(10) Patent No.: US 8,291,353 B2
(45) Date of Patent: Oct. 16, 2012

(54) NON-LINEAR RASTERIZED CONTOUR FILTERS

(75) Inventors: Zhijie Deng, Portland, OR (US); James Patrick Shiely, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/220,600

(22) Filed: Aug. 29, 2011

(65) Prior Publication Data

US 2012/0060132 A1    Mar. 8, 2012

Related U.S. Application Data

(60) Provisional application No. 61/402,932, filed on Sep. 7, 2010.

(51) Int. Cl.
*G06F 17/50* (2006.01)

(52) U.S. Cl. ............... 716/55; 716/50; 716/52; 716/53; 716/54

(58) Field of Classification Search ............ 716/50, 716/51, 52, 54, 55
See application file for complete search history.

(56) References Cited

U.S. PATENT DOCUMENTS

| | | | |
|---|---|---|---|
| 4,710,876 A | 12/1987 | Cline et al. | |
| 6,316,163 B1 * | 11/2001 | Magoshi et al. | 430/296 |
| 6,550,051 B1 * | 4/2003 | Takenouchi | 716/52 |
| 7,617,478 B2 | 11/2009 | Rieger et al. | |
| 2006/0026550 A1 * | 2/2006 | Tzu | 716/19 |
| 2010/0058282 A1 * | 3/2010 | Fujimura et al. | 716/21 |

OTHER PUBLICATIONS

Abe, T. et al., "High-Accuracy Proximity Effect Correction for Mask Writing", Japanese Journal of Applied Physics, 2007, pp. 826-833, vol. 46, No. 2.

Aya, S. et al., "Validity of Double and Triple Gaussian Functions for Proximity Effect Correction in X-ray Mask Writing," Jpn. J. Appl. Phys., Mar. 1996, pp. 1929-1936, vol. 35, Part 1, No. 3.

Chang, T. H. P., "Proximity Effect in Electron-Beam Lithography", Journal of Vacuum Science and Technology, Nov./Dec. 1975, pp. 1271-1275, vol. 12, No. 6.

Chou, S.-Y. et al., "Study of Mask Corner Rounding Effects on Lithographic Patterning for 90-nm Technology Node and Beyond," Proceedings of SPIE, 2004, pp. 508-515, vol. 5446.

Cui, Z., "Computer Simulation from Electron Beam Lithography to Optical Lithography", Technical Proceedings of the 2000 International Conference on Modeling and Simulation of Microsystems, Chapter 2, 2000, pp. 87-90.

Hattori, Y. et al., "Solution for 100nm—EBM-4000—", Proceedings of SPIE 4754, 2002, p. 697-704.

Park, D. et al., "Modeling and Correction of Global CD Uniformity Caused by Fogging and Loading Effects in 90nm Node CAR Processes", Proceedings of SPIE 5130, 2003, pp. 78-85.

* cited by examiner

*Primary Examiner* — Jack Chiang
*Assistant Examiner* — Brian Ngo
(74) *Attorney, Agent, or Firm* — Fenwick & West LLP

(57) ABSTRACT

A system includes a conversion module that preserves the shape of a contour when converting an image to a different resolution. The conversion module receives a first image and divides the first image into regions of pixel values. For each region, a contribution of the region to the pixel values in the second image is determined. The contribution is selected from a set of pre-determined contributions that are a nonlinear function of the values in the region, and the selection is made based at least in part on the values in the region. The contributions are accumulated together to generate a second image. The conversion module may be, for example, part of a design flow for an integrated circuit that connects a mask simulation stage with an optical simulation stage.

19 Claims, 16 Drawing Sheets

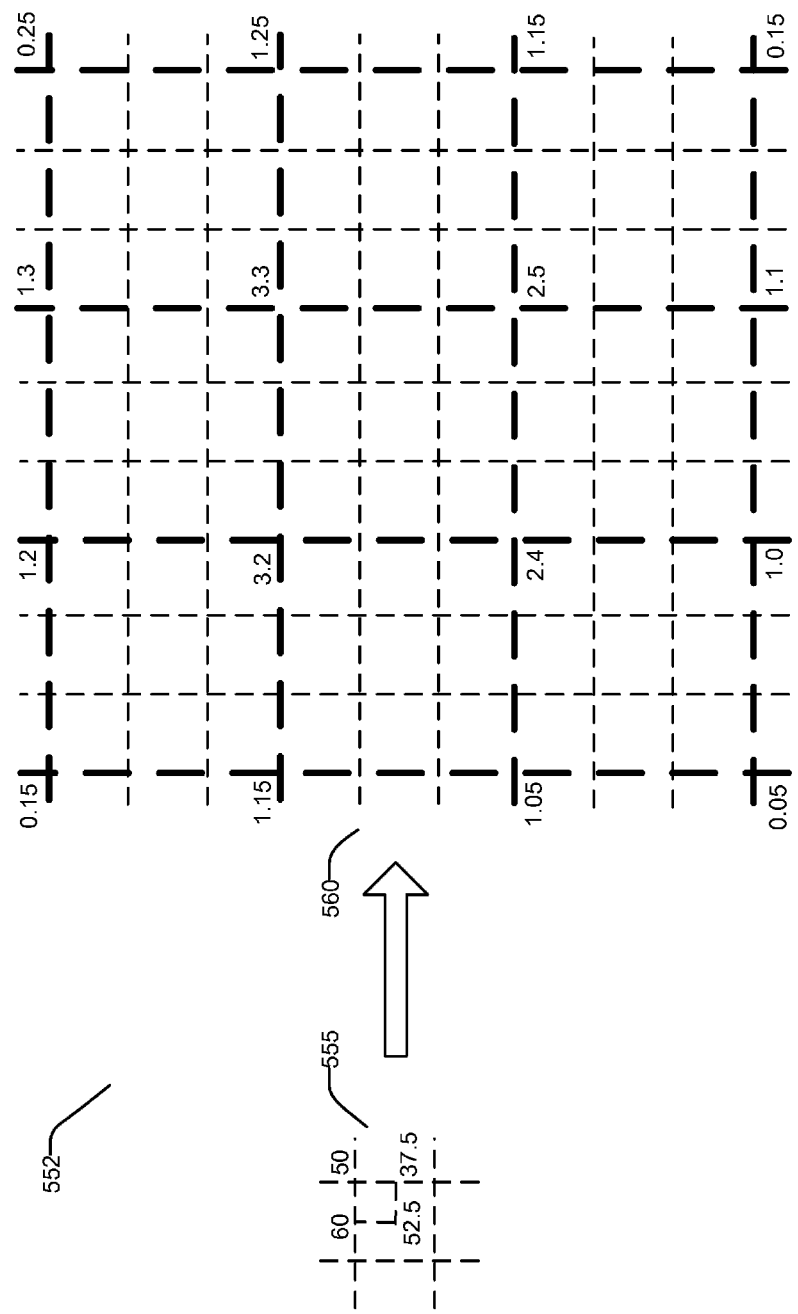

NON-LINEAR RASTERIZED CONTOUR FILTERS

CROSS-REFERENCE TO RELATED APPLICATION(S)

This application claims priority under 35 U.S.C. §119(e) to U.S. Provisional Patent Application Ser. No. 61/402,932, "Non-Linear Rasterized Contour Filters," filed Sep. 7, 2010. The subject matter of all of the foregoing is incorporated herein by reference in their entirety.

BACKGROUND OF THE INVENTION

1. Field of the Invention

This disclosure relates to rendering contours in images of different resolutions, for example, as may be useful in modeling photolithography mask-making, development and etching processes during the design flow of an integrated circuit.

2. Description of the Related Art

The use of image-processing techniques for simulation has grown in importance with increases in available memory and single instruction multiple data (SIMD) computing architectures. One operation in this field is to use images representing one or more earlier stages of the simulation as an input into a process, which then produces as its output new images that represent subsequent stages of the simulation. A common function of simulation methods is the construction of a "membership contour line" which delineates the part of the image that is "in the membership set" from the part of the image that is "out of the membership set." Note that the term "image" generally refers to two-dimensional functions and is not limited to pictures or other graphical images.

For example, the exposure dosage of e-beam photoresist used to create a mask may be represented by a function $E(x,y)$. The membership contour line may define the areas where $E(x,y)>E0$, where $E0$ is a threshold value used to model the exposure process. Points inside the membership contour line may then represent areas where the mask substrate is exposed or where the mask substrate is not exposed (depending on whether the photoresist is positive or negative). This can be used to simulate the mask making process. Given a mask, a similar approach can also be used to simulate the exposure dosage of photoresist on a substrate that is exposed using the mask.

Regardless of the application, contour lines can be used in subsequent stages of simulation. For example, it may be desirable to produce contour lines from one simulation stage with a certain spatial resolution (e.g., simulation of the mask making stage), and then subsequently use these contour lines as inputs into another simulation stage of a different spatial resolution (e.g., simulation of the substrate patterning stage). However, contour lines typically have an infinite bandwidth and it is therefore not possible to reconstruct them with 100% accuracy from a pixelized image. In addition, the contouring step is typically non-linear, so that the problem cannot be solved by straightforwardly applying a linear filter to the original bandlimited image.

One approach to resolving this problem is to produce a vector-based graphical representation of the contour line as an intermediate result, and then feed the vector graphics into a rasterizer to condition them to the bandwidth appropriate for the subsequent stage. However, construction of the vector-based contour line from the image (for example, by using a threshold criterion) can be slow and memory intensive. It can also introduce artifacts when attempting to approximate the path of curves. Examples of artifacts include splitting geometries, merging geometries and the development of holes. In addition, the resulting vector function is then rasterized back into an image in order to feed it into the subsequent bandlimited simulation stage. Accurately rasterizing these complex vector graphics can also take a great deal of time.

SUMMARY OF THE INVENTION

The present invention overcomes the limitations of the prior art by converting contour information from one pixelized image into another pixelized image through the use of pre-determined contributions.

In one aspect, a system includes a conversion module that receives a first pixelized image. The pixel values in the image define a contour line based on the relationships of the pixel values to a threshold value. The conversion module generates a second pixelized image with pixels that have a different resolution than the pixels in the first image. Specifically, the conversion module divides the first image into different regions of values. For each region, a contribution of the region to the pixel values in the second image is determined. The contribution is selected from a set of pre-determined contributions that are a nonlinear function of the values in the region, and the selection is made based at least in part on the values in the region. The nonlinear function relates to the threshold value and the contour line. For example, regions with pixel values that are all above the threshold may all have the same contribution, and regions with pixel values that are all below the threshold may have a different contribution. The contributions are accumulated together to generate the second image.

The conversion module enables faster and more precise conversion of a contour in one image into a contour in a second image. By generating the second image using pre-determined contributions, the conversion module can preserve the approximate shape of the contour without requiring a vector-based representation of the contour. The pre-determined contributions preferably are computed in advance to reduce the run-time of the conversion module. In one embodiment, the pre-determined contributions may be stored in a lookup table for fast access.

In another aspect, the image may be divided into different types of regions. Regions may be single-tile regions, where a tile is a 2×2 array of pixel values from the original pixelized image. Regions may be multi-tile regions that include several tiles. Regions may be sub-tile regions that are less than a single tile. Tiles or regions may also be extremum regions, corner regions, or edge regions depending on the pixel values of the tile or region relative to the threshold value.

In yet another aspect, the module is integrated into a design flow for an integrated circuit that connects a mask simulation stage with an optical simulation stage. The conversion module receives an image that represents the e-beam exposure of e-beam photoresist used to create a mask. The conversion module then generates a pseudoimage suitable for use in the optical simulation stage. The optical simulation stage simulates exposure of photoresist for lithography on a substrate, using the mask created by the e-beam exposure.

Other aspects of the invention include methods and computer readable media corresponding to the devices and systems described above.

BRIEF DESCRIPTION OF THE DRAWINGS

The invention has other advantages and features which will be more readily apparent from the following detailed description of the invention and the appended claims, when taken in conjunction with the accompanying drawings, in which:

FIGS. 5A-5F are examples of different entries in a lookup table that associate regions with pre-determined contributions, according to an embodiment.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

EDA Design Flow

Figure 1:
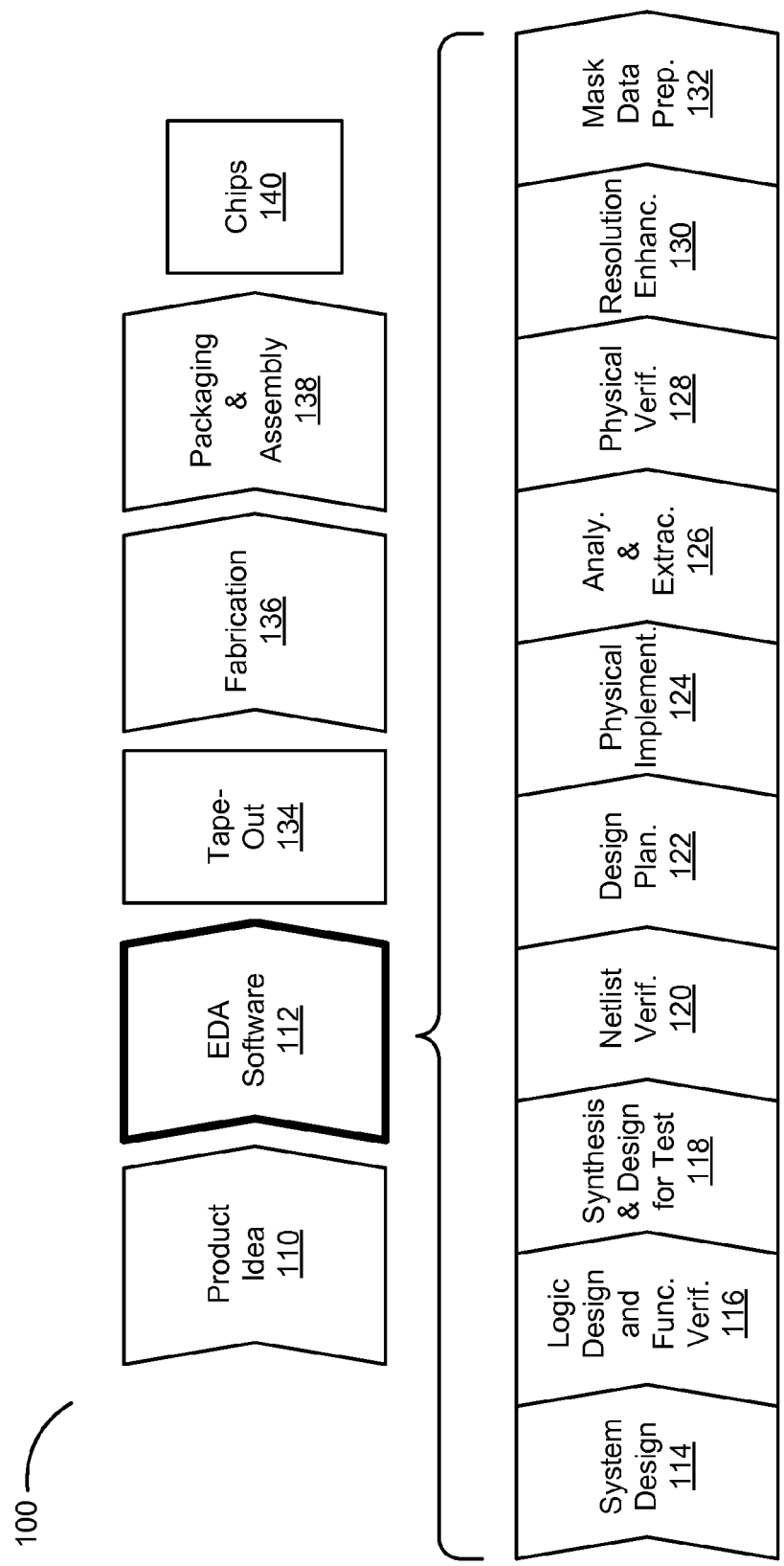
FIG. 1 is a flowchart 100 illustrating the various operations in the design and fabrication of an integrated circuit, according to an embodiment.

FIG. 1 is a flowchart 100 illustrating the various operations in the design and fabrication of an integrated circuit. This process starts with the generation of a product idea 110, which is realized during a design process that uses electronic design automation (EDA) software 112. When the design is finalized, it can be taped-out 134. After tape-out, a semiconductor die is fabricated 136 to form the various objects (e.g., gates, metal layers, vias) in the integrated circuit design. Packaging and assembly processes 138 are performed, which result in finished chips 140.

Note that the design process that uses EDA software 112 includes operations 114-132, which are described below. This design flow description is for illustration purposes. In particular, this description is not meant to limit the present disclosure. For example, an actual integrated circuit design may require a designer to perform the design operations in a different sequence than the sequence described herein.

During system design 114, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include Model Architect®, Saber® and System Studio® products.

During logic design and functional verification 116, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include VCS®, Vera®, Magellan®, Formality®, ESP® and Leda® products.

During synthesis and design for test 118, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include Design Compiler®, Physical Compiler®, Test Compiler®, Power Compiler®, FPGA Compiler®, Tetramax®, and Designware® products.

During netlist verification 120, the netlist is checked for compliance with timing constraints and for correspondence with the VHDL/Verilog source code. Example EDA software products from Synopsys, Inc. of Mountain View, Calif. that can be used at this stage include Formality®, Primetime®, and VCS® products.

During design planning 122, an overall floor plan for the chip is constructed and analyzed for timing and top-level routing. Example EDA software products from Synopsys, Inc. of Mountain View, Calif. that can be used at this stage include Astro® and IC Compiler® products.

During physical implementation 124, the placement (positioning of circuit elements) and routing (connection of the same) occurs. Example EDA software products from Synopsys, Inc. of Mountain View, Calif. that can be used at this stage include the Astro® and IC Compiler® products.

During analysis and extraction 126, the circuit function is verified at a transistor level, which permits refinement. Example EDA software products from Synopsys, Inc. of Mountain View, Calif. that can be used at this stage include Astrorail®, Primerail®, Primetime®, and Star RC/XT® products.

During physical verification 128, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 130, the layout undergoes lithographic simulations and geometric manipulations of the layout are performed to improve manufacturability of the design. Lithographic simulation is a two step process that involves mask image simulation and optical image simulation ("optical" is intended to include all wavelength bands used for patterning substrates). In some embodiments, the techniques of the present disclosure may be used to convert an image produced during mask image simulation into a format that is appropriate for optical image simulation. In other embodiments, the rendering techniques of the present disclosure can also be used in other applications that involve multiple image-based simulation stages. Example EDA software products from Synopsys, Inc. of Mountain View, Calif. that can be used at this stage include Proteus®, Proteus®AF, and PSMGED® products.

During mask-data preparation 132, the "tape-out" data for production of masks to produce finished chips is provided. Example EDA software products from Synopsys, Inc. of Mountain View, Calif. that can be used at this stage include the CATS® family of products.

Image Conversion Overview

Figure 2:
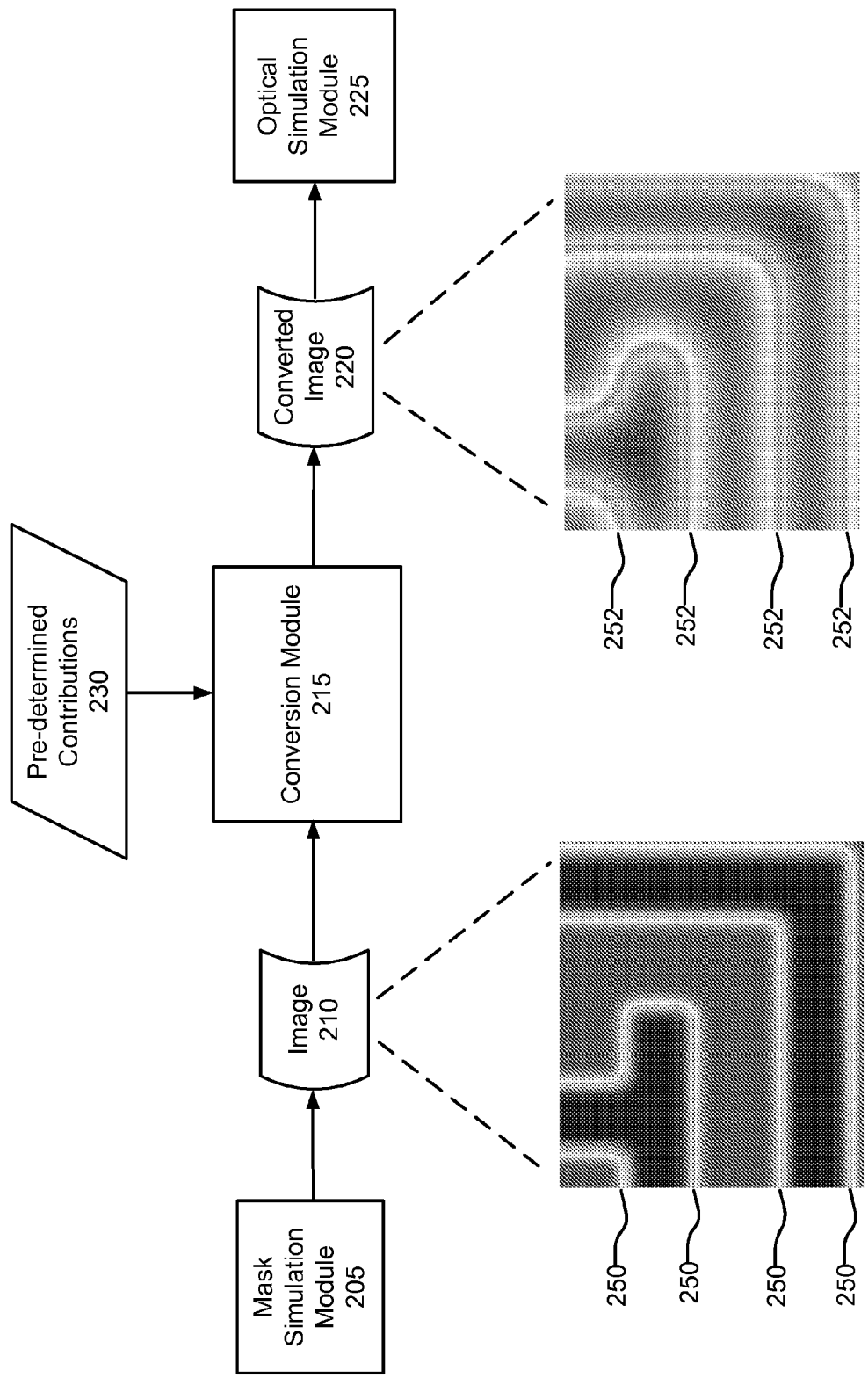
FIG. 2 is a process flow for image conversion, according to an embodiment.

FIG. 2 illustrates a process flow for image conversion, according to an embodiment. In one embodiment, a mask simulation module 205 generates a pixelized image 210 that represents an e-beam exposure of photoresist across a mask substrate. This exposure is used to pattern the mask. The values of the pixels in the image 210 correspond to the intensity of the e-beam exposure and define contour lines 250 that separate areas of the image with values above a threshold value from areas of the image that are below the threshold value. Areas on one side of the contours 250 may represent areas of the mask substrate that are exposed during fabrication of the mask (i.e., e-beam photoresist is removed), and areas on the other side of the contours 250 may represent areas of the mask substrate that are not exposed during fabrication, thus defining the mask.

A conversion module 215 converts the pixelized image 210 into another pixelized image 220 before it is fed into the optical simulation module 225. Pixelized image 220 has a different resolution (higher or lower resolution) than pixelized image 210. In some embodiments, the original image 210 is a high resolution image but the optical simulation module 225 is bandwidth limited and prefers lower resolution images for shorter runtime. The conversion module 215 thus converts the original image 210 into another image 220 having a lower resolution that is appropriate for the optical simulation module 225. In some embodiments, the converted image 220 is a pseudoimage that implicitly represents the locations of one or more contour lines 252 through its pixel values. The contour lines 252 are related to contour lines 250. For example, contour lines 252 may be lower resolution versions of the contour lines 250.

To convert the original image 210 into the converted image 220, the conversion module 215 uses a set of pre-determined contributions 230 that map regions of the original image 210 into pixel values for the converted image 220. The pre-determined contributions 230 act as a sort of non-linear rasterized contour filter that preserves an approximate shape of the contour lines 250 during the conversion process. The pre-determined contributions 230 may not preserve the exact shape of the contour lines 250 because they may condition (e.g., by filtering out high frequency contour information) the contours 250 during the conversion process. Conditioning of the contours occurs because the optical simulation module 225 may not be designed to handle high-frequency contour information. Thus, performing the conditioning in the conversion module 215 saves time during later calculations performed by the optical simulation module 225.

The pre-determined contributions 230 are computed in advance and may be stored in a lookup table. Each entry in the lookup table associates a certain configuration of values in a region of the original image 210 with a contribution to the pixel values of the converted image 220. There may be a large number (e.g., over 100) of entries in the lookup table in order to handle many different configurations of values in the original image 210. The pre-determined contributions relate to the threshold value and the contour line and, since the contouring process is a non-linear process, the pre-determined contributions are a non-linear function with respect to the values in the regions of the original image 210.

The optical simulation module 225 uses the converted image 220 to simulate the effect of optical distortions that may occur during the fabrication of an integrated circuit. The optical simulation module 225 applies an optical model to the converted image 220 to generate a final image (not shown). This final image represents the appearance of various features in a post-fabrication integrated circuit that accounts for mask and optical distortions occurring during the lithography process.

By converting the image 210 with a set of pre-determined contributions 230, an approximate shape of a contour 250 in the original image 210 may be preserved without requiring the time consuming process of converting the original pixelized image 210 into a vector image and then converting the vector image back into a different pixelized image 220. Specifically, test results have shown that in some cases, the disclosed conversion process is ten times faster than conventional techniques for lithographic simulation while producing more accurate results.

Method of Image Conversion

Figure 3:
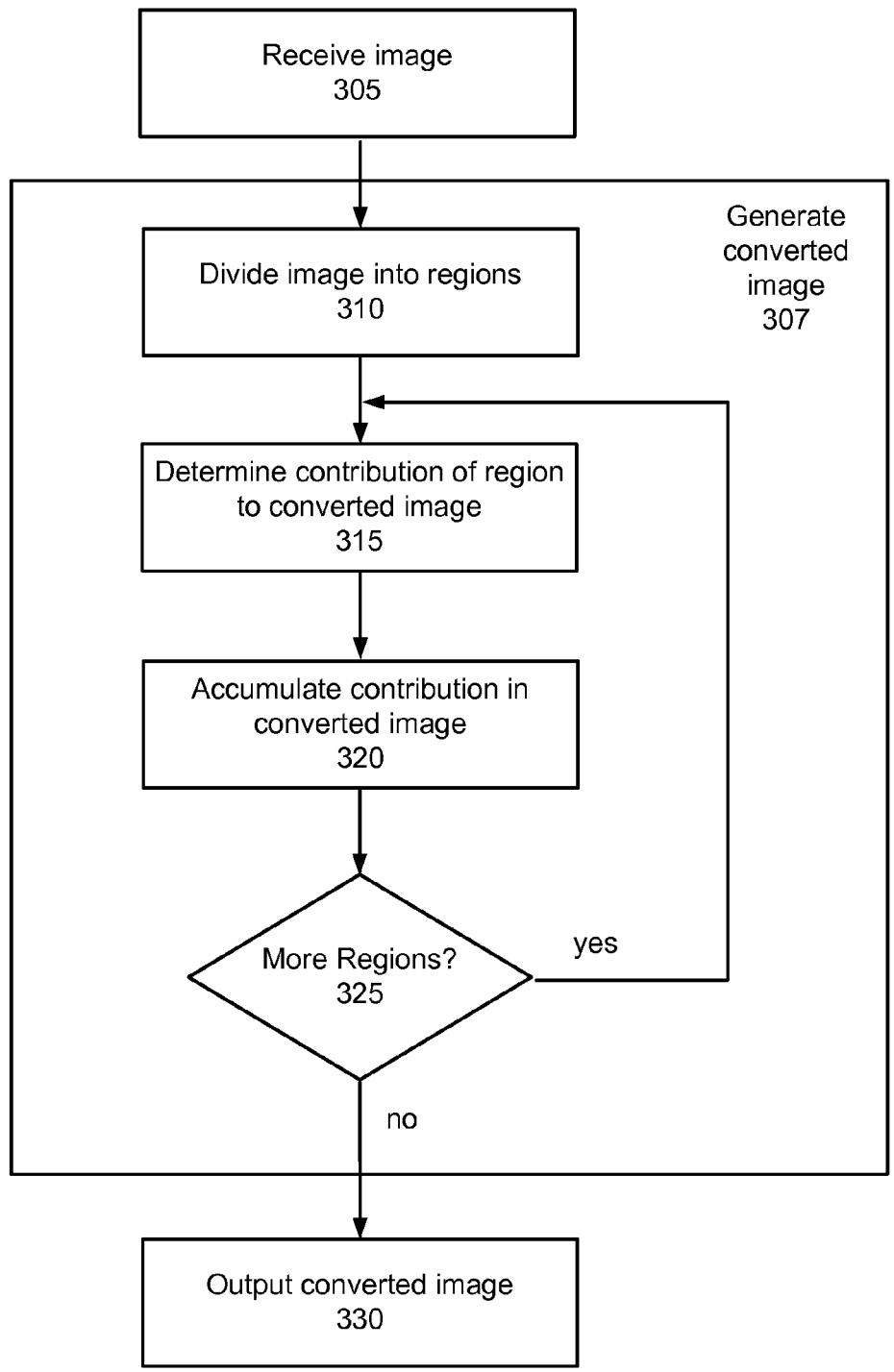
FIG. 3 is a method for image conversion performed by the conversion module, according to an embodiment.

FIG. 3 illustrates a method for image conversion performed by the conversion module 215, according to an embodiment. In step 305, the conversion module 215 receives a pixelized image, for example from the mask simulation module 205, from another software process, or from a storage device. The image may include a large number of pixels, and each 2×2 array of pixels is considered a tile of pixels. Tiles can be classified as extremum tiles, edge tiles, or corner tiles, as will be explained in conjunction with FIG. 4B. In step 307, the conversion module 215 generates a converted image from the received image. In step 330, the conversion module 215 outputs the converted image, for example, by outputting the image to the optical simulation module 225, to another software process, or by storing the image to a storage device.

The step 307 of generating the converted image includes several sub-steps 310-325. In step 310, the conversion module 215 divides the image into different regions. Regions may include, for example, single tile regions, multi-tile regions, or sub-tile regions. Multi-tile regions include multiple tiles, and sub-tile regions are portions of a single tile that are smaller than a single tile. In one embodiment, dividing the image into regions comprises determining whether each tile is an extremum tile, edge tile or corner tile. Regions are then constructed from the tiles based on whether the tiles are extremum tiles, edge tiles or corner tiles, as will be explained in conjunction with FIGS. 4C, 4D, and 4E. In one embodiment, a region is a rectangular array of values, for example, pixel values for single tile and multi-tile regions or sub-pixel values for sub-tile regions.

In step 315, for a given region, the conversion module 215 determines a contribution of the region to the pixel values of the converted image from the set of pre-determined contributions. For example, the values for a particular region may be matched against entries in a lookup table to select the corresponding contribution. In step 320, the contribution is accumulated into the converted image, for example, by adjusting the pixel values of the converted image. In step 325, if there are more regions, steps 315 and 320 are repeated until the contribution of each region of the first image is accumulated into the converted image. The converted image can thus be viewed as an image that is initially blank and then pieced together by accumulating the pre-determined contributions from each region.

Image Regions

Figure 4A:
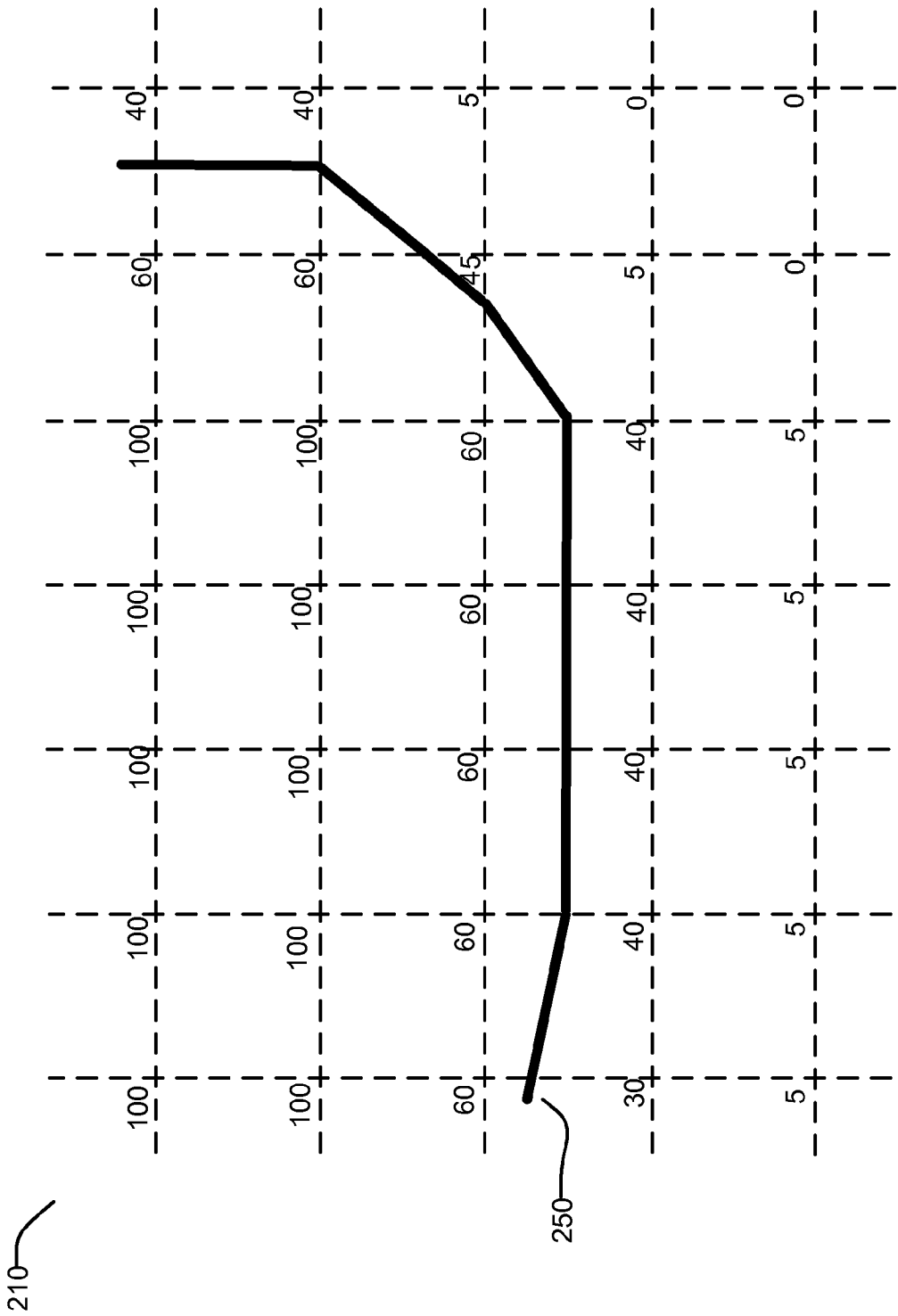
FIGS. 4A-4E illustrate dividing a pixelized image into regions, according to an embodiment.

FIG. 4A illustrates a detailed view of a portion of the pixelized image 210 from FIG. 2 and a contour line 250 in the pixelized image 210, according to an embodiment. As shown, the pixelized image 210 includes a total of 35 pixels that are represented by the intersections of the dotted lines. Each pixel has a value indicated by the number that is adjacent to each pixel. In this example, each pixel has a value of between 0-100. Zero represents the lowest possible amount of e-beam exposure and 100 represents the maximum level of e-beam exposure. In other embodiments, the pixels may have different values. Additionally, every 2×2 square of pixels forms a tile of pixels. Thus, in FIG. 4A there are a total of 24 tiles.

The threshold value for this image 210 is a value of 50. The contour line 250 represents the approximate location in the image 210 where the exposure level is 50. Pixels that have a value higher than 50 are referred to as within the contour line, whereas pixels with values below 50 will be referred to as outside of the contour line. The values of the pixels in a pixelized image 250 thus implicitly represent the location of a contour line 250, and the approximate position of the contour line 250 can be extracted by interpolating the pixel values.

In one embodiment, each tile is considered a single region. Since there are 24 tiles, the pixelized image can be divided into 24 regions. For each region, the region's contribution to the output image can be determined from a set of pre-determined contributions. For example, the pixel values for a region may be matched against entries in a lookup table to select an appropriate contribution.

Figure 4B:
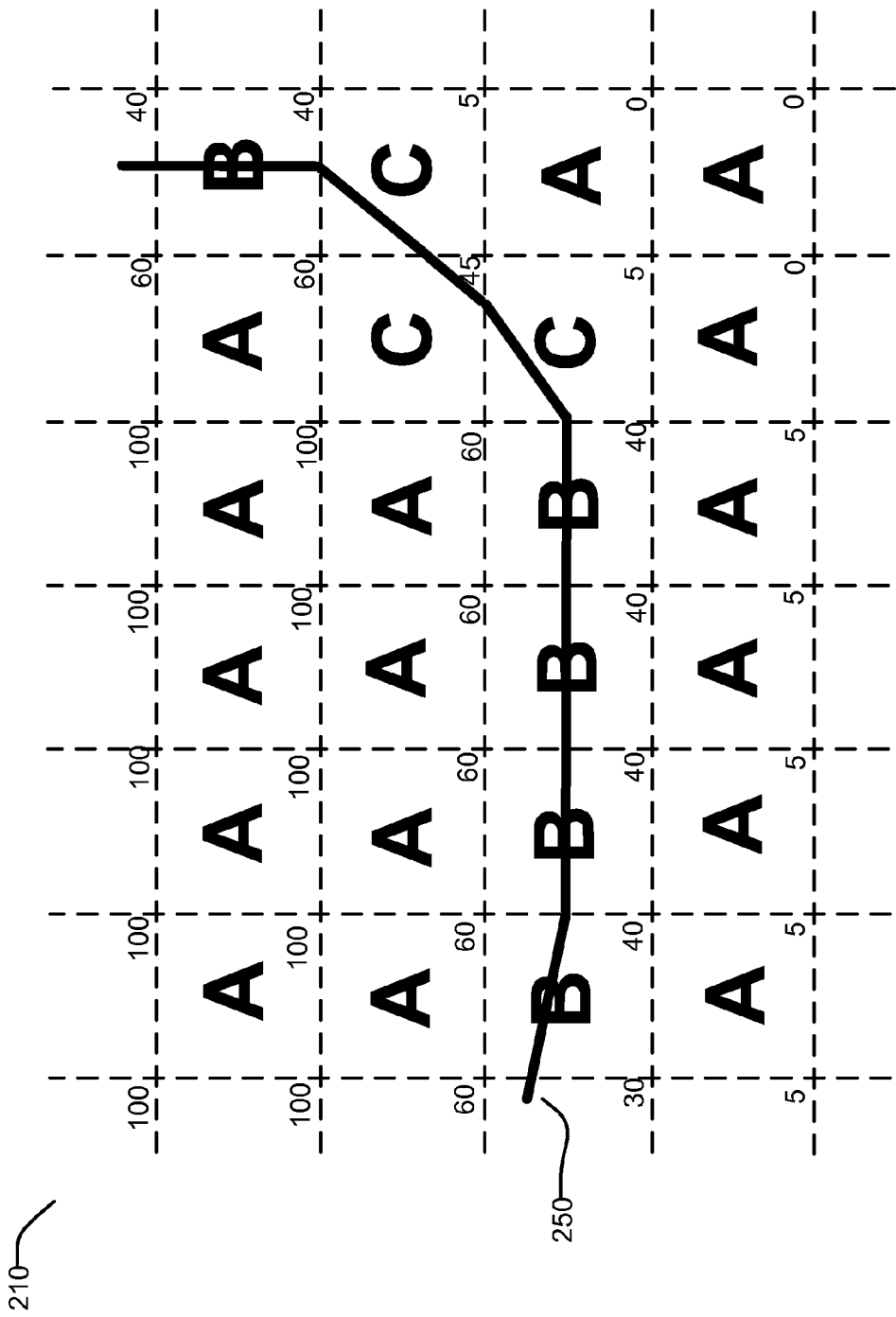

FIG. 4B illustrates how the regions of a pixelized image 210 can be classified into different categories, according to an embodiment. In FIG. 4B, there are 24 regions and each region includes a single tile. Regions marked with the letter A are extremum regions or extremum tiles. Extremum regions are regions where all of the pixel values are either greater than or less than the threshold value. For example, an extremum region may be a region where the pixel values are 60, 60, 100 and 100, all of which exceed the threshold value of 50. Extremum regions are thus either entirely inside the contour line or entirely outside the contour line, but not overlapping the contour line 250 itself. In one embodiment, extremum regions that are inside the contour line contribute to the pixel values of converted image, while extremum regions that are outside the contour line do not contribute to the pixel values of the converted image (or vice versa).

Regions marked with the letter B are edge regions or edge tiles. Edge regions are regions where the pixel values along one edge of the region are greater than the threshold value and the values along the opposite edge of the region are less than the threshold value. For example, an edge region may be a region where the pixel values on one edge are 60 and 60 and the pixel values on the opposite edge are 40 and 40, assuming a threshold value of 50. The values of an edge region indicate that the contour line runs 250 across the region from one edge of the region to an opposite edge of the region.

Regions marked with the letter C are corner regions or corner tiles. Corner regions are regions where the pixel values at three of the four corners of the region are either greater than or less than the threshold value. For example, a corner region may be a region where the pixel values at its corners are 5, 40, 45 and 60, assuming a threshold value of 50. The values of a corner region indicate that the contour line 250 runs across the region from one edge of the region to an adjacent edge of the region.

Figure 4C:
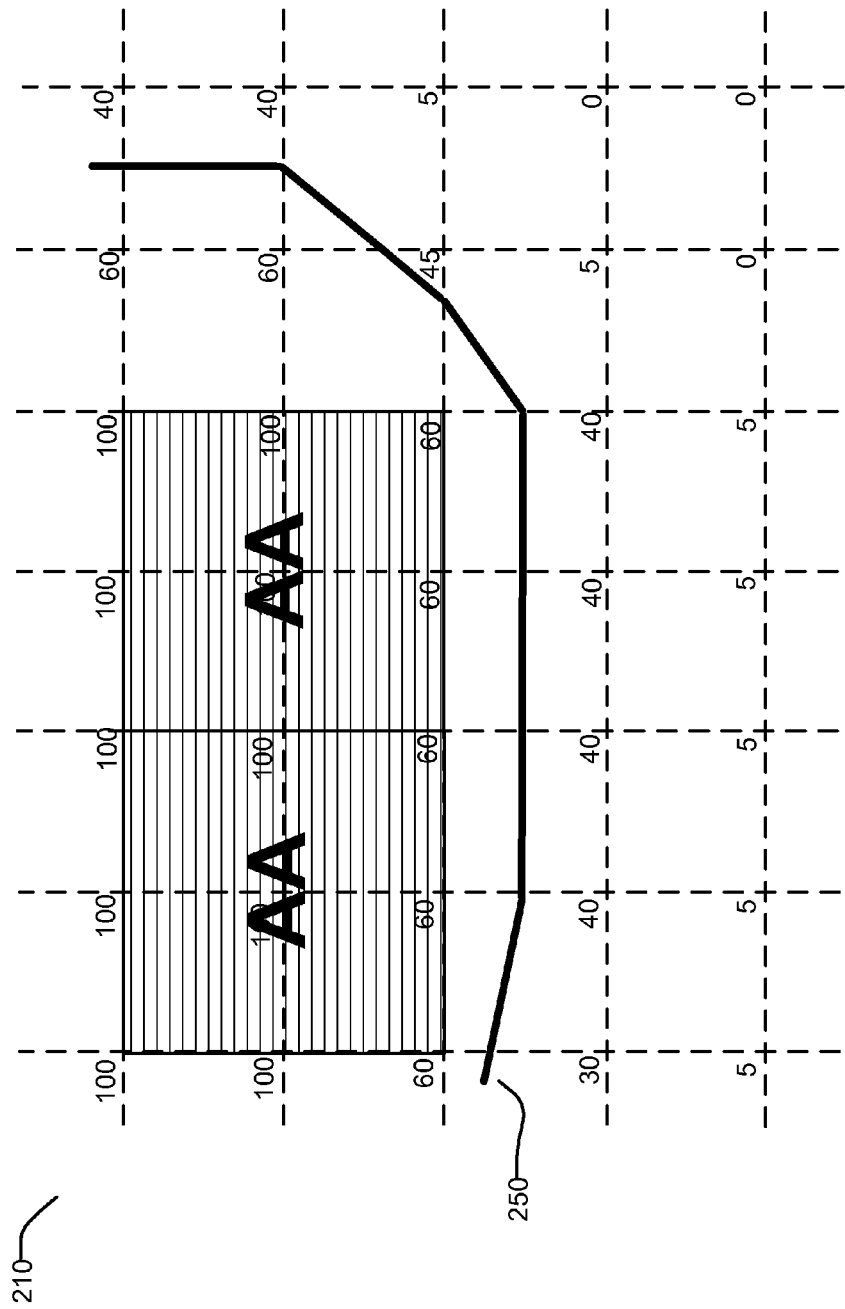

FIG. 4C illustrated how tiles can be grouped together to form multi-tile regions, according to an embodiment. For extremum tiles, the conversion module 120 may aggregate several adjacent extremum tiles together to construct larger multi-tile regions that are shown with the letters AA. Each multi-tile region AA includes four individual tiles arranged as a rectangular 2×2 block of tiles. In other embodiments, the multi-tile regions AA may include a different integer number of tiles and/or have a different shape. For example, another type of multi-tile region can include sixteen individual tiles arranged as a 4×4 block of tiles. If an image is divided into multi-tile regions or single-tile regions, then each of the regions includes an integer number of tiles.

Once a multi-tile regions AA is formed, the conversion module 215 can determine a single contribution for the entire multi-tile region AA instead of determining separate contributions for each of the individual tiles in the multi-tile region AA. If the contributions are stored in a lookup table, this reduces the number of accesses to the lookup table and speeds up the process of generating the converted image.

Additionally, the multi-tile region AA can be viewed as having interior points, edge points, and corner points. Interior points are pixels inside the multi-tile region. Corner points are pixels at the four corners of the multi-tile region. Edge points are pixels located along the edge of the multi-tile region between the corner points. Any combination of corner, pixel, and edge pixel values can be used to identify a matching entry in the lookup table. In one embodiment, all the pixel values (e.g., interior, edge and corner) for a multi-tile region AA are used in matching an entry in the lookup table. In one embodiment, only the corner and edge pixels of a multi-tile region AA are used in matching an entry in the lookup table, and so the selected contribution is independent of the interior pixel values. In another embodiment, only the corner pixels of a multi-tile region AA are used in selecting a matching entry.

Figure 4D:
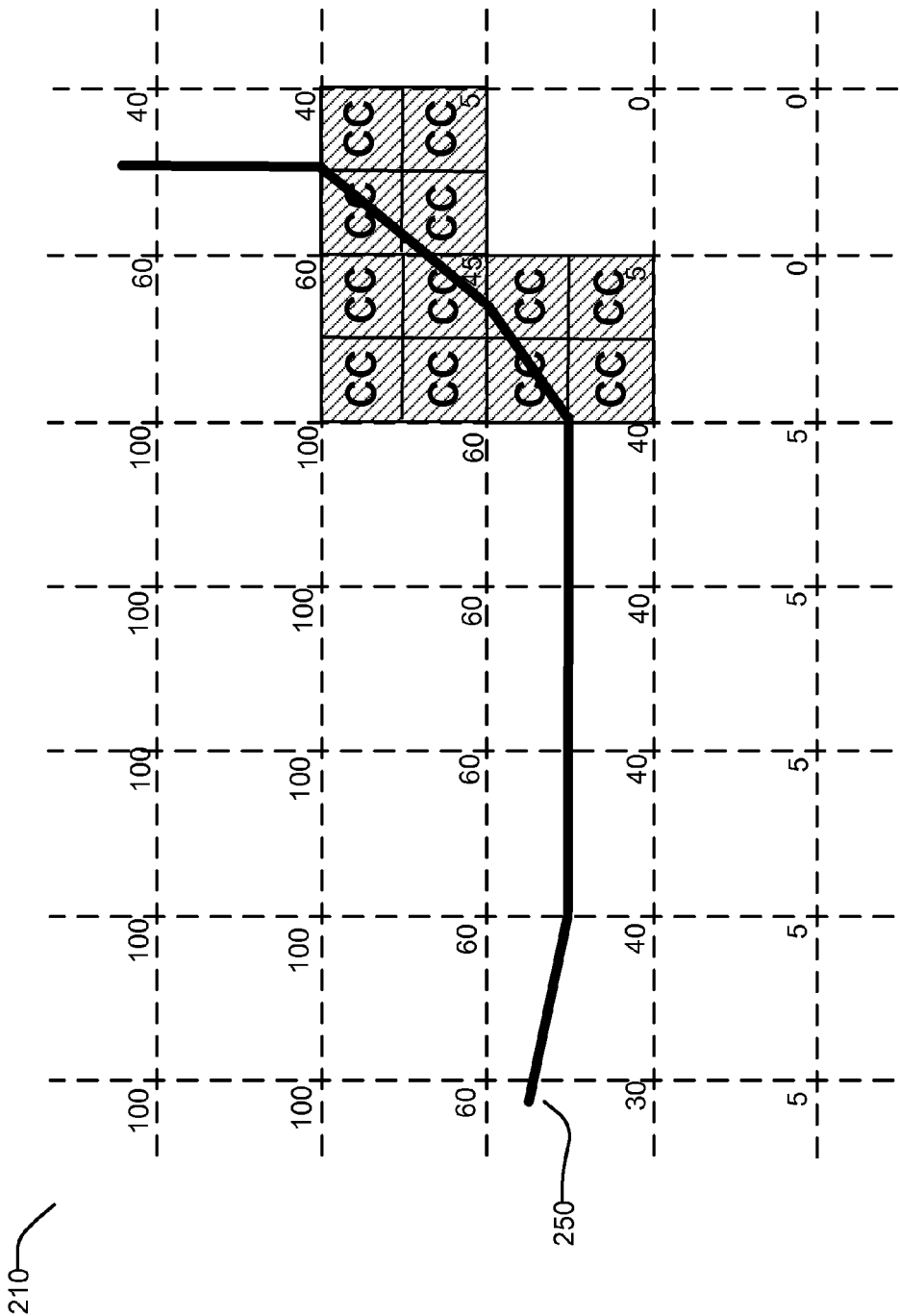

FIG. 4D illustrates how corner tiles can be sub-divided into sub-tile regions, according to an embodiment. Shown are three corner tiles C. For corner tiles, the conversion module 120 may sub-divide the corner tiles into several smaller sub-tile regions that are shown with the letter CC. Each corner tile is divided into four rectangular sub-tile regions CC that form a 2×2 block of sub-tile regions CC. In other embodiments, there may be a different number of sub-tile regions CC and the sub-tile regions CC may have a different shape.

Figure 4E:
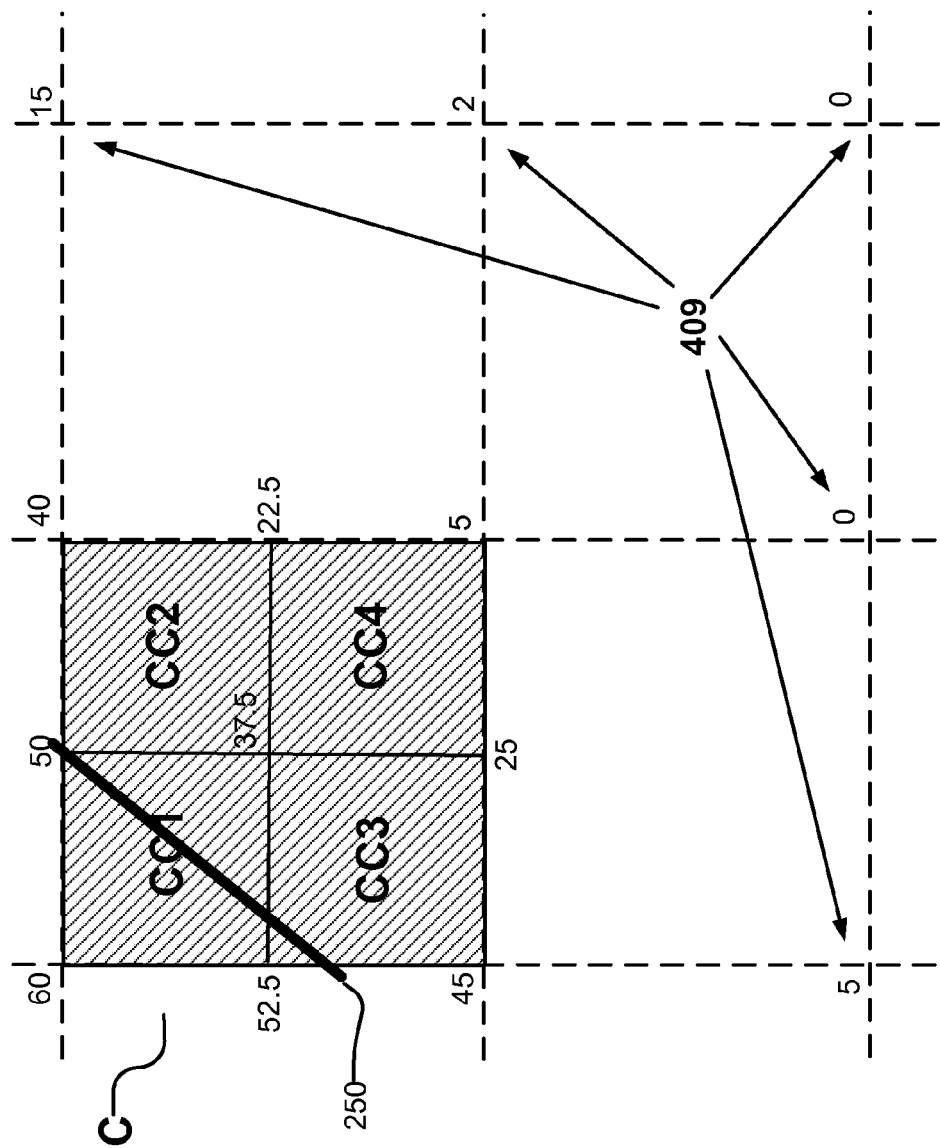

FIG. 4E illustrates how a corner tile C can be sub-divided to form sub-tile regions in greater detail, according to an embodiment. Shown is a single corner tile C and three adjacent extremum tiles. The corner tile C has been split into four sub-tile regions CC1, CC2, CC3 and CC4. Each sub-tile region is assigned four sub-pixel values that represent the approximate pixel value at each of its corners. In one embodiment, the sub-pixel values can be obtained through an interpolation of the pixels in the corner tile C. For example, sub-tile region CC1 is assigned sub-pixel values of 60, 50, 37.5, and 52.5. Sub-pixel value 50 is obtained through a linear interpolation of the adjacent pixel values of 60 and 40. Similarly, sub-tile region CC2 has sub-pixel values of 50, 40, 22.5 and 37.5. Sub-tile region CC3 has sub-pixel values of 52.5, 37.5, 25 and 45. Sub-tile region CC4 has sub-pixel values of 37.5, 22.5, 25 and 5. The pixel values for the different sub-tile regions indicate that the contour 250 passes through sub-tile regions CC1 and CC3 but not sub-tile regions CC2 or CC4.

In a more advantageous embodiment, the sub-pixel values are not obtained by simply interpolating the pixel values from the corner region C itself. Instead, the sub-pixel values are influenced by pixel values from both the corner tile C and from pixel values that are outside 409 of the corner tile C itself. Determining the sub-pixel values from pixel values outside of the corner tile C allows for the location of the contour 250 to be more accurately represented in the sub-tile regions CC. For example, if sub-pixel values are determined solely by analyzing the pixel values of the corner tile C, the contour 250 represented by the sub-tile regions CC is completely straight. However, if sub-pixel values are determined by also analyzing the pixel values outside 409 of the corner region C, the sub-pixels may have values indicating that the contour 250 has a bend.

Once the sub-tile regions CC are formed, the conversion module 215 can determine separate contributions for each of the sub-tile regions CC and accumulate these contributions in the converted image. The corner tiles typically contain detailed contour information that is difficult to preserve unless the corner tiles are sub-divided into smaller regions. Thus, although sub-dividing the corner tiles may require additional calculations, it is beneficial for increasing the accuracy of the contours represented by the converted image.

Pre-determined Contributions

FIGS. 5A-5F are examples of different entries in a lookup table that associate regions with pre-determined contributions. Although only six entries are shown in the figures, in other embodiments there may be hundreds or thousands of entries representing many different regions and their associated contributions. Additionally, FIGS. 5A-5F represent entries in a lookup table for converting a higher resolution image into a lower resolution image. In other embodiments, the look table may include entries for converting a lower resolution image into a higher resolution image.

Figure 5A:
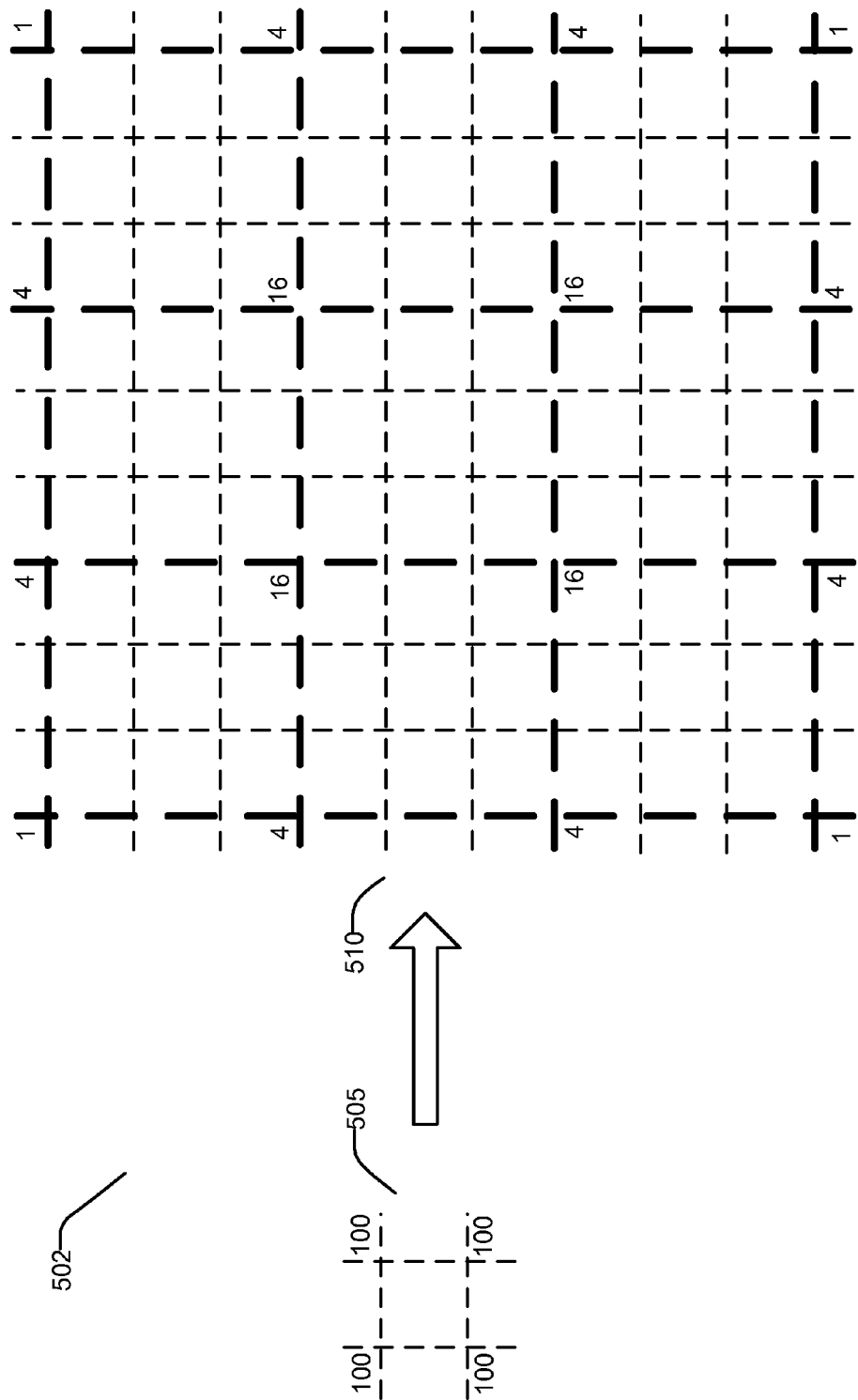

FIG. 5A represents an entry 502 in the lookup table that associates a region 505 with a pre-determined contribution 510, according to an embodiment. Region 505 is a single tile created from four pixels. The pixel values in region 505 are 100, 100, 100 and 100. If the threshold value is 50, the pixel values indicate that region 505 is an extremum region. Region 505 is associated in the lookup table with a pre-determined contribution 510 that is also comprised of several pixels. The pixels in the pre-determined contribution 510 have a lower resolution than the pixels in the region 505. For example, region 505 may represent a portion of a higher resolution image, whereas contribution 510 represents a portion of a lower resolution image. Contribution 510 has pixel values of 1, 4, 4, 1, 4, 16, 16, 4, 4, 16, 16, 4, 1, 4, 4 and 1.

To use the lookup table, the conversion module 215 compares pixel values in a select region of the original image 210 to the entries in the lookup table to identify a matching entry. Once a match is found, the contribution for that particular entry is accumulated into the converted image. For example, if a region from the original image 210 matches region 505, the conversion module 215 would accumulate contribution 510 into the converted image. Specifically, the pixel values in contribution 510 would be added to the pixel values of the converted image. This process of looking up and accumulating contributions is repeated for each region of the original image 210 to generate the converted image.

Figure 5B:
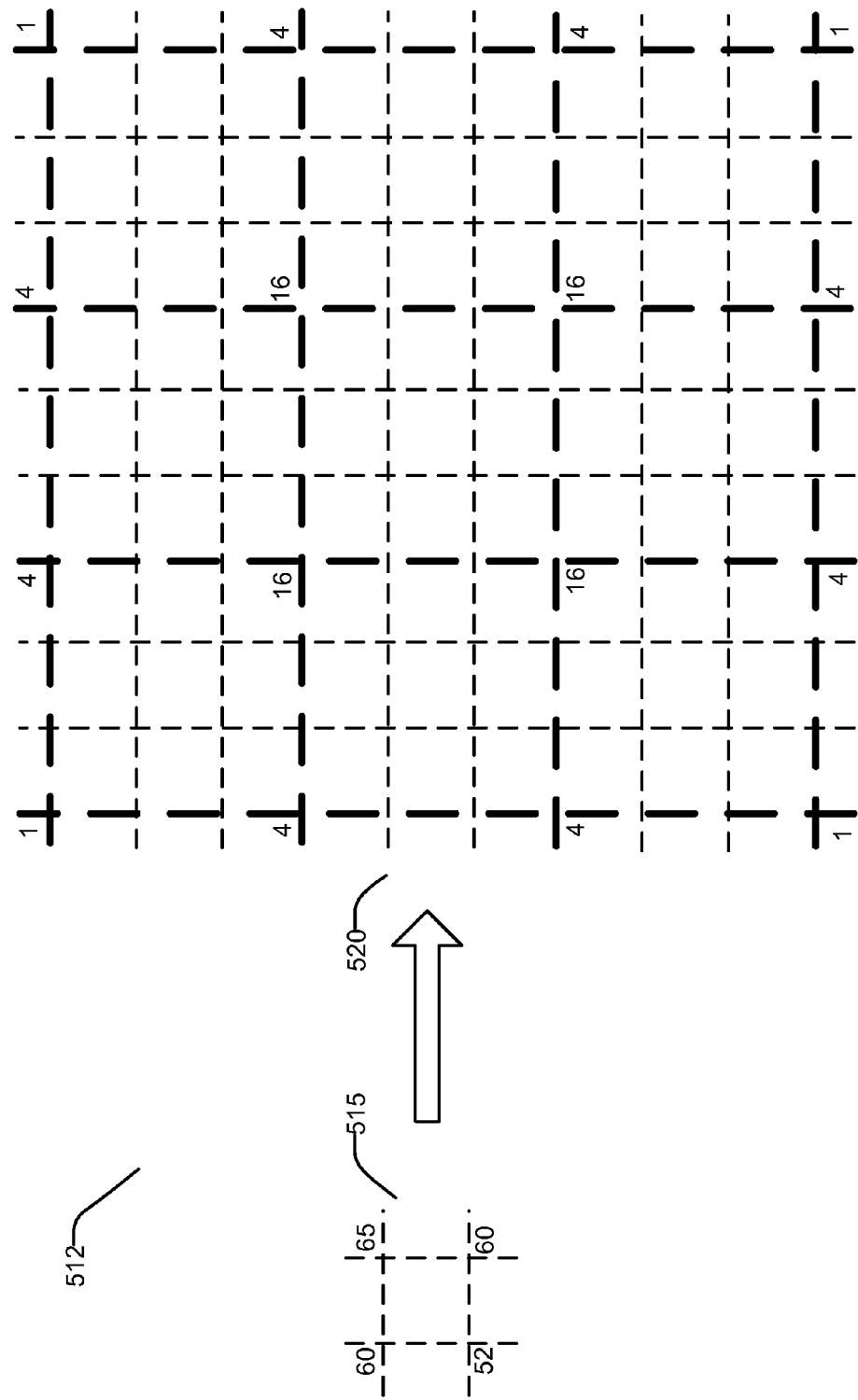

FIG. 5B represents another entry 512 in the lookup table that associates a region 515 with a pre-determined contribution 520, according to another embodiment. The entry in the lookup table includes a region 515 that represents a single tile created from four pixels. The pixel values in the region 515 are 60, 65, 52 and 60 (where the values are listed from left to right, and top to bottom). These pixel values indicate that this region 515 is also an extremum region, assuming the threshold value is 50. The region 515 is associated with pre-determined contribution 520 that is comprised of several lower resolution pixels. The pixel values in the pre-determined contribution 520 are 1, 4, 4, 1, 4, 16, 16, 4, 4, 16, 16, 4, 1, 4, 4 and 1.

As shown in FIGS. 5A and 5B, regions with different values may nonetheless have the exact same contribution. For example, regions 505 and 515 have different values. However, the contributions 510 and 520 for both regions are exactly the same. Converting an image using the pre-determined contributions thus results in a non-linear image conversion. The conversion is non-linear in the sense that the pixel values for the contribution from a region are not a linear function of the values in the region. In one embodiment, extremum regions with pixel values that exceed the threshold value share the same contribution. Extremum regions with pixel values that do not exceed the threshold value share the same, but different contribution. In fact, the two entries 502 and 512 may be combined into a single entry. The region is defined as an extremum region with all values >50 and the corresponding contribution is the same as contributions 510, 520.

Figure 5C:
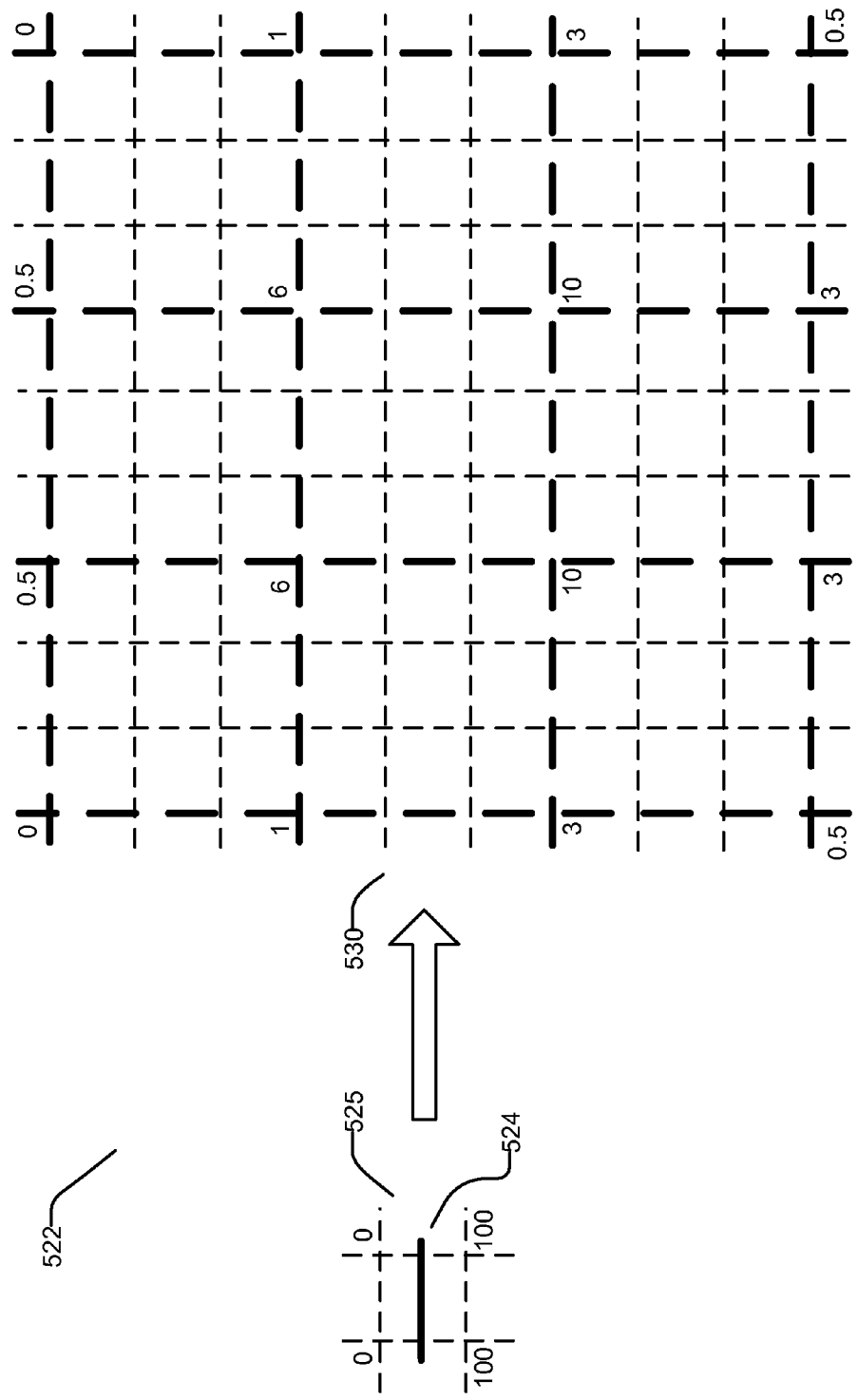

FIG. 5C represents another entry 522 in the lookup table that associates a region 525 with a pre-determined contribution 530, according to another embodiment. The entry 522 includes a region 525 that represents a single tile created from four pixels. The pixel values in region 525 are 0, 0, 100 and 100. The pixel values indicate that region 525 is an edge region. The location of the contour that would pass through this edge region 525 is indicated by the dark line 524. Region 525 is associated with pre-determined contribution 530 that is comprised of several lower resolution pixels. The pixel values in the pre-determined contribution 530 are 0, 0.5, 0.5, 0, 1, 6, 6, 1, 3, 10, 10, 3, 0.5, 3, 3 and 0.5.

The lookup table can take advantage of similarities between regions to reduce the total number of entries. For example, a region with pixel values 0, 0, 100, 100 and a region with pixel values of 100, 0, 100, 0 may share the same entry in the lookup table. Because these regions are just rotations of each other, a single entry in the lookup table can be combined with the orientation of the values to identify a contribution that is rotated (or otherwise geometrically transformed) as necessary before it is accumulated into the converted image.

Figure 5D:
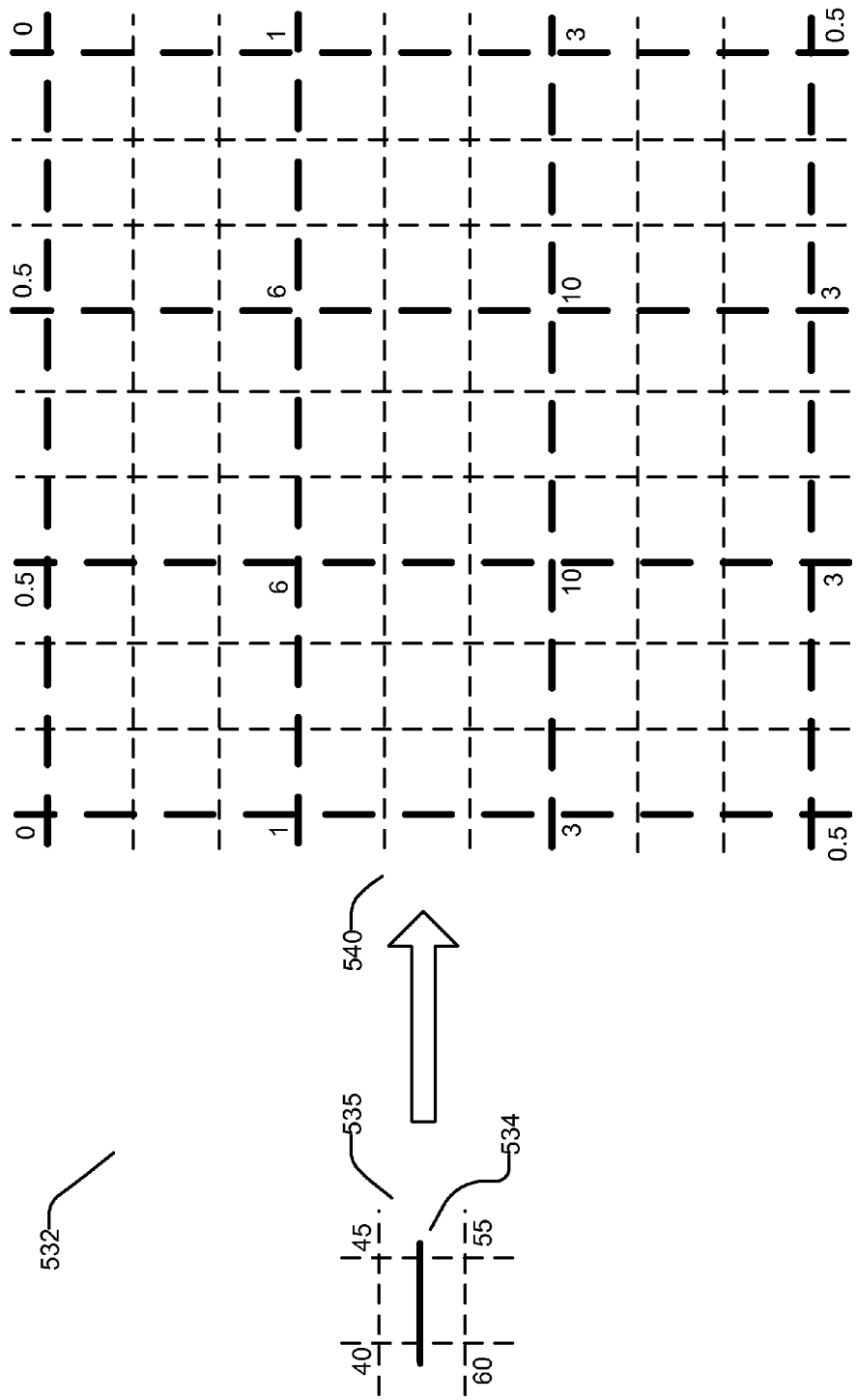

FIG. 5D represents another entry 532 in the lookup table that associates a region 535 with a pre-determined contribution 540, according to another embodiment. The entry 532 includes a region 535 that represents a single tile created from four pixels. The pixel values in region 535 are 40, 45, 60 and 55. The pixel values indicate that region 535 is an edge region. The location of the contour that would pass through this edge region 535 is indicated by the dark line 534. Region 535 is associated with pre-determined contribution 540 that is comprised of several lower resolution pixels. The pixel values in the pre-determined contribution 540 are 0, 0.5, 0.5, 0, 1, 6, 6, 1, 3, 10, 10, 3, 0.5, 3, 3 and 0.5.

In FIGS. 5C and 5D, the contributions 530 and 540 for both regions 525 and 535 are exactly the same. Note also that for both region 525 and region 535, the contours 524 and 534 are located in the exact same position. Generally speaking, edge regions that have similar contour locations correspond to similar or the same contributions. Edge regions that have dissimilar contour locations correspond to different contributions.

Figure 5E:
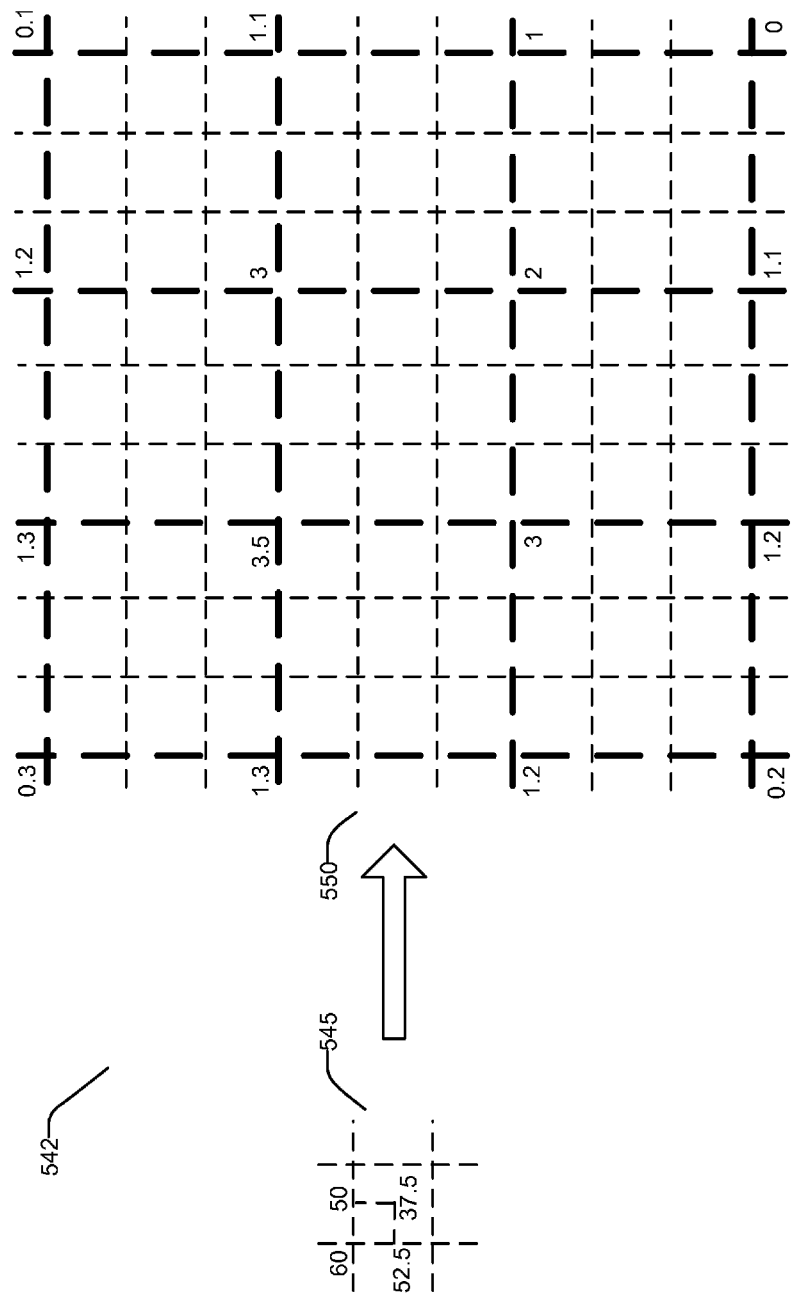

FIG. 5E represents another entry 542 in the lookup table that associates a region 545 with a pre-determined contribution 550, according to another embodiment. The entry 542 includes a region 545 that represents a sub-tile region. The sub-pixel values in region 545 are 60, 50, 52.5 and 37.5. Region 545 is associated with pre-determined contribution 550 that is comprised of several lower resolution pixels. The pixel values in the pre-determined contribution 550 are 0.3, 1.3, 1.2, 0.1, 1.3, 3.5, 3, 1.1, 1.2, 3, 2, 1, 0.2, 1.2, 1.1 and 0.

FIG. 5F represents another entry 552 in the lookup table that associates a region 555 with a pre-determined contribution 560, according to another embodiment. Sub-tile region 555 has the same values as sub-tile region 545 from FIG. 5E, but is shifted to the right within the tile. As a result, the pixel values in the pre-determined contribution 560 are different than the pixel values in pre-determined contribution 550. The pixel values in the pre-determined contribution 560 are 0.15, 1.2, 1.3, 0.25, 1.15, 3.2, 3.3, 1.25, 1.05, 2.4, 2.5, 1.15, 0.05, 1.0, 1.1 and 0.15.

Figure 6:
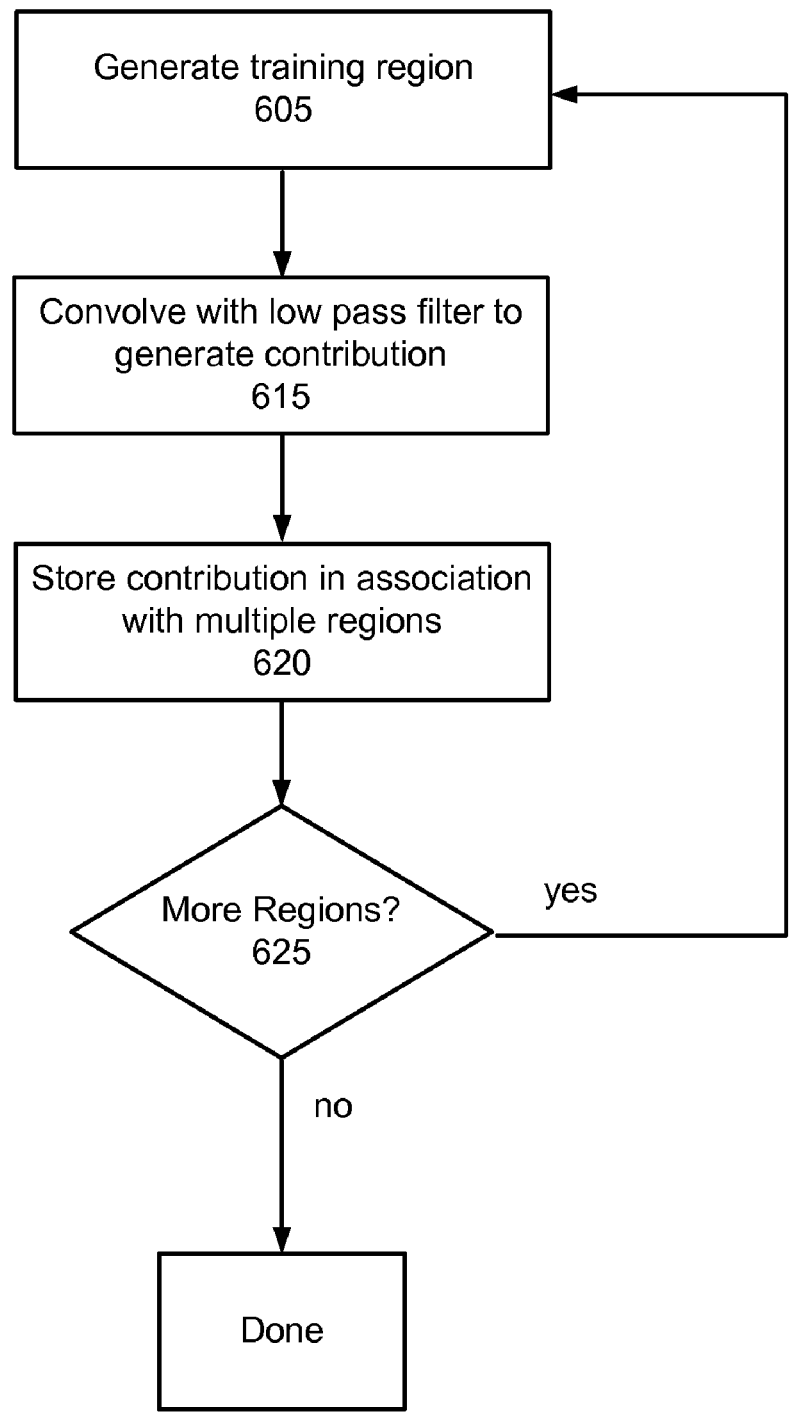
FIG. 6 is method of generating pre-determined contributions, according to an embodiment.

FIG. 6 is a method of generating pre-determined contributions, according to an embodiment. This process can occur in advance of the process shown in FIG. 3 so that the pre-determined contributions are available to the conversion module 215 during the process of generating the converted image.

In step 605, a training region is generated that represents a potential appearance of an image region. For example, the training region may have values that represent an extremum region within the contour region, an extremum region outside the contour region, various edge regions or various sub-tile regions. The training region has a resolution that is higher than the resolution of the input image 210. Additionally, the values in the training region have one value if they represent a portion of the training region that is within the contour line, and have another value if they represent a portion of the training region that is outside of the contour line.

Figure 7:
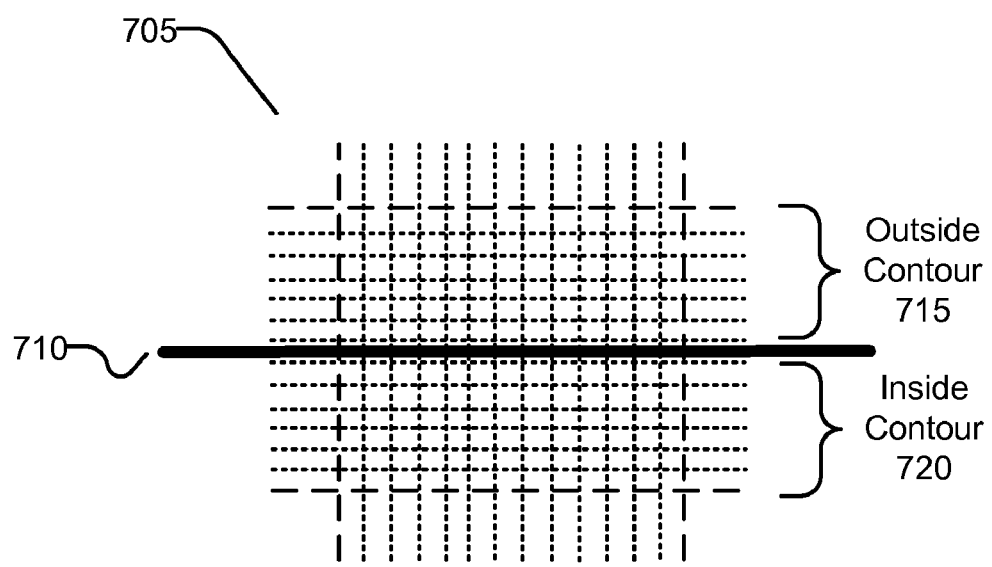
FIG. 7 is an example of a training region, according to an embodiment.

FIG. 7 illustrates a training region 705 that represents an edge region where the contour line 710 passes directly through the middle of the edge region, according to an embodiment. For example, training region 705 may represent edge region 525 from FIG. 5C or edge region 535 from FIG. 5D. The training region 705 has a high resolution with many sample points on both sides of the contour line 710. Sample points 715 outside the contour line have one value (e.g., 0). Sample points 720 inside the contour line 710 have another value (e.g., 100).

Referring again to FIG. 6, in step 615, the training region is convolved with a low pass filter. The cutoff frequency of the low pass filter may be determined by the target resolution of the image that will be generated when the lookup table is used during the process of FIG. 3. The result of the convolution is a lower resolution configuration of pixel values that is the pre-determined contribution. For example, the contributions may be similar to the contributions shown in FIGS. 5A-5F.

In one embodiment, the convolution process is performed with the following function:

$$F(X,Y) = \iint LPFim(X-\zeta, Y-\eta) T(\zeta, \eta) d\zeta d\eta \quad (1)$$

F(X,Y) is the value of the contribution at the pixel coordinates X and Y. LPFim is the spatial domain impulse function of the low pass filter. T is the high resolution training region. $\zeta$ and $\eta$ are the coordinate values for the high resolution training region. The integration shown in the formula is performed for a number of X and Y coordinates to generate the pre-determined contribution. In other embodiments, the convolution of step 615 may be performed in either the spatial domain or the frequency domain.

In step 620, the pre-determined contribution is stored as an entry in the lookup table in conjunction with regions that have a similar appearance to the training region. For example, if the training region is an extremum region within the contour line, the contribution could be associated with one or more extremum regions within the contour line. If the training region is an extremum region outside of the contour line, the contribution could be associated with one or more extremum regions outside of the contour line. If the training region is an edge region or corner region representing a specific contour location, the contribution could be associated with other regions that represent the same contour location.

Because the values in the training region are set based on whether they represent areas inside the contour line or outside the contour line, and also because each pre-determined contribution is associated with different image regions, this results in a set of pre-determined contributions that represent a non-linear transformation of their associated image regions.

In one embodiment, the entries in the lookup table may be similar to the entries shown in FIG. 5A-5F. The entries in FIG. 5A-5F are shown graphically for purposes of clarity. However, in other embodiments the data representation of the entries may be in any form that is appropriate for storage in a lookup table. For example, the entries may simply be stored as arrays of values that are associated with other arrays of pixel values.

In step 625, the process may be repeated many times (e.g. hundreds or thousands of times) to generate a pre-determined contribution for many possible different regions. Although the process of generating the pre-determined contributions may be time consuming, it only needs to be performed a single time. Once the pre-determined contributions are generated, they can be reused many times in the conversion of many different images.

Although the detailed description contains many specifics, these should not be construed as limiting the scope of the invention but merely as illustrating different examples and aspects of the invention. It should be appreciated that the scope of the invention includes other embodiments not discussed in detail above. For example, although the image conversion techniques described herein may be used during mask-making and lithography simulation, the embodiments are not limited to this and can be used in other situations where images with contours are being converted. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

In alternate embodiments, the invention is implemented in computer hardware, firmware, software, and/or combinations thereof. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

The term "module" is not meant to be limited to a specific physical form. Depending on the specific application, modules can be implemented as hardware, firmware, software, and/or combinations of these. Furthermore, different modules can share common components or even be implemented by the same components. There may or may not be a clear boundary between different modules.

Depending on the form of the modules, the "coupling" between modules may also take different forms. Dedicated circuitry can be coupled to each other by hardwiring or by accessing a common register or memory location, for example. Software "coupling" can occur by any number of ways to pass information between software components (or between software and hardware, if that is the case). The term "coupling" is meant to include all of these and is not meant to be limited to a hardwired permanent connection between two components. In addition, there may be intervening elements. For example, when two elements are described as being coupled to each other, this does not imply that the elements are directly coupled to each other nor does it preclude the use of other elements between the two.

What is claimed is:

1. A non-transitory computer readable medium storing instructions that, when executed on a computer system, cause the computer system to carry out a method for converting a pixelized image of an e-beam exposure for a mask to a different resolution pseudoimage suitable for photolithography simulation while preserving a shape of a contour line defined by a threshold value for the e-beam exposure, the method comprising:
  receiving a first pixelized image of an e-beam exposure for a mask having a plurality of first pixels, with first pixel values the first pixels defining a contour line for the e-beam exposure based on the first pixel values in relation to an e-beam threshold value;
  generating a second pixelized image from the first pixelized image, the second pixelized image having a plurality of second pixels with a different resolution than the plurality of first pixels, wherein generating the second pixelized image comprises:
  dividing the first pixelized image into regions of values, the values determined from the first pixel values wherein at least one of the regions is smaller than a 2×2 array of the first pixels that corresponds to a corner of the contour line;
  for each region, determining a contribution of the region to the second pixel values in the second pixelized image, wherein the contribution is selected from a set of predetermined contributions that are a nonlinear function of the regions of values, the nonlinear function relating to the threshold value and the contour line, the selection based at least in part on the values in the region; and
  accumulating the contributions of the regions to generate the second pixelized image, the second pixelized image suitable for photolithography simulation.

2. The computer readable medium of claim 1, wherein the step of determining a contribution of the region to the second pixel values comprises:
  using a lookup table to determine a contribution of the region to the second pixel values, the lookup table associating the predetermined contributions with the corresponding regions of values.

3. The computer readable medium of claim 1, wherein the predetermined contributions represent a low pass filtering of the regions of values.

4. The computer readable medium of claim 1, wherein the predetermined contributions are selected to preserve a shape of the contour line.

5. The computer readable medium of claim 1, wherein at least one of the regions comprises a rectanguar array of values.

6. The computer readable medium of claim 1, wherein at least one of the regions is a size of a 2×2 array of the first pixels.

7. The computer readable medium of claim 1, wherein at least one of the regions is larger than a 2×2 array of the first pixels.

8. The computer readable medium of claim 1, wherein at least one of the regions is an edge region, wherein all the values along one edge of the edge region are greater than the threshold value and all the values along an opposite edge of the edge region are less than the threshold value.

9. The computer readable medium of claim 1, wherein at least one of the regions is a corner region, wherein the values for three of four corners of the corner region are either greater than or less than the threshold value.

10. The computer readable medium of claim 1, wherein at least one of the regions is an extremum region, wherein all the values for the extremum region are either greater than or less than the threshold value.

11. The computer readable medium of claim 10, wherein the extremum region is larger than a 2×2 array of the first pixels.

12. The computer readable medium of claim 1 wherein, for at least one of the regions, the contribution selected depends on a portion of the values outside the region.

13. The computer readable medium of claim 1 wherein the second pixelized image is a representation of the contour line.

14. A non-transitory computer readable medium storing instructions that, when executed on a computer system, cause the computer system to carry out a method for converting a pixelized image to a different resolution while preserving a shape of a contour line defined by a threshold value, the method comprising:
  receiving a first pixelized image having a plurality of first pixels with first pixel values, the first pixels defining a contour line based on the first pixel values in relation to a threshold value;
  generating a second pixelized image from the first pixelized image, the second pixelized image having a plurality of second pixels with a different resolution than the plurality of first pixels, wherein generating the second pixelized image comprises:
  dividing the first pixelized image into regions of values, the values determined from the first pixel wherein at least one of the regions is smaller than a 2×2 array of the first pixels and corresponds to a corner of the contour line;
  for each region, determining a contribution of the region to the second pixel values in the second pixelized image, wherein the contribution is selected from a set of predetermined contributions that are a nonlinear function of the regions of values, the nonlinear function relating to the threshold value and the contour line, the selection based at least in part on the values in the region; and
  accumulating the contributions of the regions to generate the second pixelized image.

15. The computer readable medium of claim 14, wherein at least one of the regions is a size of a 2×2 array of the first pixels.

16. The computer readable medium of claim 14, wherein at least one of the regions is larger than a 2×2 array of the first pixels.

17. A method for converting a pixelized image to a different resolution while preserving a shape of a contour line defined by a threshold value, the method comprising:

receiving a first pixelized image having a plurality of first pixels with first pixel values, the first pixels defining a contour line based on the first pixel values in relation to a threshold value;

generating, by a computer, a second pixelized image from the first pixelized image, the second pixelized image having a plurality of second pixels with a different resolution than the plurality of first pixels, wherein generating the second pixelized image comprises:

dividing the first pixelized image into regions of values, the values determined from the first pixel wherein at least one of the regions is smaller than a 2×2 array of the first pixels that corresponds to a corner of the contour line;

for each region, determining a contribution of the region to the second pixel values in the second pixelized image, wherein the contribution is selected from a set of predetermined contributions that are a nonlinear function of the regions of values, the nonlinear function relating to the threshold value and the contour line, the selection based at least in part on the values in the region; and accumulating the contributions of the regions to generate the second pixelized image.

18. The method of claim 17, wherein at least one of the regions is a size of a 2×2 array of the first pixels.

19. The method of claim 17, wherein at least one of the regions is larger than a 2×2 array of the first pixels.

* * * * *